(12) United States Patent
Jiang

(10) Patent No.: US 8,604,597 B2
(45) Date of Patent: Dec. 10, 2013

(54) MULTI-DIE PACKAGES INCORPORATING FLIP CHIP DIES AND ASSOCIATED PACKAGING METHODS

(75) Inventor: Hunt Hang Jiang, Saratoga, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 250 days.

(21) Appl. No.: 13/096,634

(22) Filed: Apr. 28, 2011

(65) Prior Publication Data
US 2012/0273929 A1    Nov. 1, 2012

(51) Int. Cl.
*H01L 23/495* (2006.01)

(52) U.S. Cl.
USPC .... 257/676; 257/690; 257/777; 257/E23.044; 438/25; 438/107; 438/118; 438/123

(58) Field of Classification Search
USPC .......... 257/676, 690, 774, 777–778, E23.044; 438/25, 107, 118, 123, 125
See application file for complete search history.

(56) References Cited

U.S. PATENT DOCUMENTS

| 7,642,135 B2* | 1/2010 | Liang ............................ 438/113 |
| 2009/0230517 A1* | 9/2009 | Bathan et al. ................. 257/666 |

* cited by examiner

*Primary Examiner* — Mark A Laurenzi
(74) *Attorney, Agent, or Firm* — Perkins Coie LLP

(57) ABSTRACT

The present technology discloses a multi-die package. The package comprises a lead frame structure and three dies including a first flip chip die, a second flip chip die and a third flip chip die stacked vertically. The first flip chip die is mounted on the bottom surface of the lead frame structure through the flip chip bumps; the second flip chip is mounted on the top surface of the first flip chip die through flip chip bumps; and the third flip chip die is mounted on the top surface of the lead frame structure through flip chip bumps.

19 Claims, 5 Drawing Sheets

US 8,604,597 B2

MULTI-DIE PACKAGES INCORPORATING FLIP CHIP DIES AND ASSOCIATED PACKAGING METHODS

TECHNICAL FIELD

The present technology generally relates to multi-die packages incorporating flip chip dies and methods of packaging.

BACKGROUND

Miniaturization and portability are overwhelming trends in customer electronics which pushed the Integrated Circuit (IC) package to be more compact. New packaging methods, for example, three-dimension packaging (3D-Packaging) technology, have been used to achieve such goals. For the 3D-packaging technology, two or more dies with respective functions are overlapped one onto another in a single package. The packaged dies might include central processing unit (CPU) chips, field-programmable gate array (FPGA) chips, radio frequency (RF) chips, memory chips, flash chips, analog chips, power device chips, and so on. Compared with conventional 2D-packaging methods for which dies are placed side by side, the 3D packaging method stacks the dies in a compact space with small footprint on a printed circuit board (PCB). Also, the 3D-packaging technique can allow packages to have shorter delay, lower noise, higher speed, and fewer parasitical effects than other packaging techniques.

FIG. 1 illustrates a tri-stacked 3D-package 11 in accordance with the prior art. An integrated circuit system 10 includes a first IC die 101 such as a controller die, a second IC die 102 such as a first power die, and a third die 103 such as a second power die stacked on one another. The integrated circuit system 10 is assembled in the package 11 as a ball grid array package in FIG. 1. The third IC die 103 is attached to a top surface of a package substrate 112 and solder balls 113 are positioned on a back surface of the package substrate 112 to connect the package 11 onto a PCB.

The electrical communication between the stacked dies 101,102,103 and the package substrate 112 is formed by metal bonding wires 111. The bonding wires 111 are leaded from the contact pads 115 on the dies 101,102,103, and are attached to the substrate 112. The electrical connection among dies 101, 102, 103 can also be by bonding wires 111 (not shown in FIG. 1).

Although the package 11 can provide relatively high packaging density, it has drawbacks due to the bonding wires. First, the bonding wires require extra area beyond the dies 101, 102, 103 for wire span and contact pad on substrate, and thus can limit further miniaturization of the package 11. Also, a lower die must be large enough than the upper die to expose the contact pad for connection, thus the die area is restricted. Additionally, a relatively thin and long metal bonding wire typically has relative high resistance, parasitical capacity and inductance unsuitable in a high power system. Finally, the use of wire bonding technology can have high cost and high process time because the wires are made of gold and fabricated one layer at a time.

DETAILED DESCRIPTION

Various embodiments of semiconductor packages and processes of manufacturing are described below. The term "flip chip" is used here to include any packaged chip that the solder area of the die directly couples to a lead frame structure or a package substrate by bump/bumps. Many of the details, dimensions, angles, shapes, and other features shown in the figures are merely illustrative of particular embodiments of the technology. A person skilled in the relevant art will also understand that the technology may have additional embodiments, and that the technology may be practiced without several of the details of the embodiments described below with reference to FIGS. 2A-6.

One embodiment of the present technology is directed to a multi-die package that comprises a lead frame structure, a first flip chip die, a second flip chip die, and a third flip chip die stacked vertically. The first flip chip die is mounted on and electrically coupled to a bottom surface of the lead frame structure through a plurality of first flip chip bumps. The second flip chip die is flipped down, mounted on and electrically coupled to the first flip chip die through a plurality of second flip chip bumps. The third flip chip die is flipped down, mounted on and electrically coupled to a top surface of the lead frame structure through a plurality of third flip chip bumps.

Figure 1A:
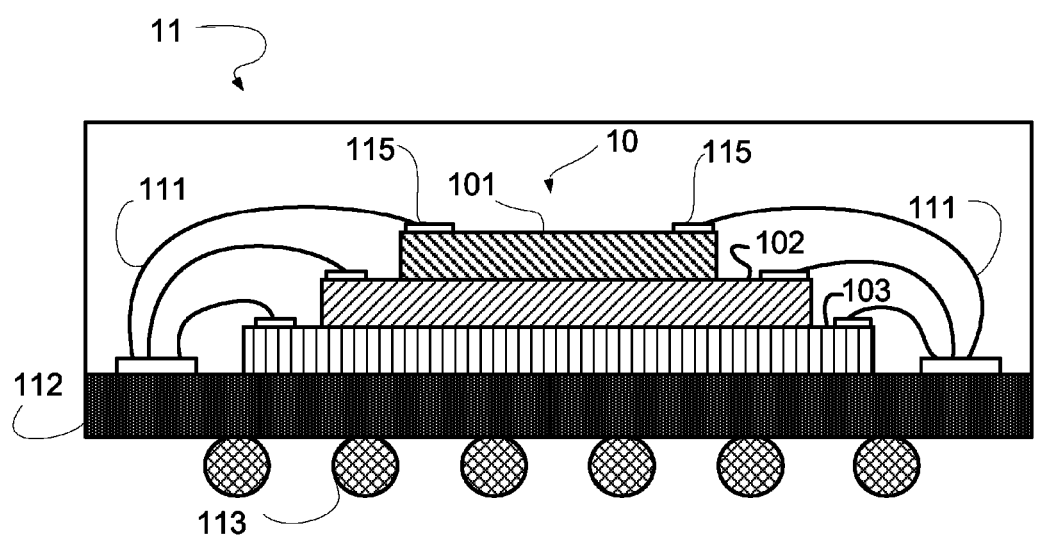
FIG. 1 shows a conventional tri-stacked 3D-package according to the prior art.
Figure 2A:
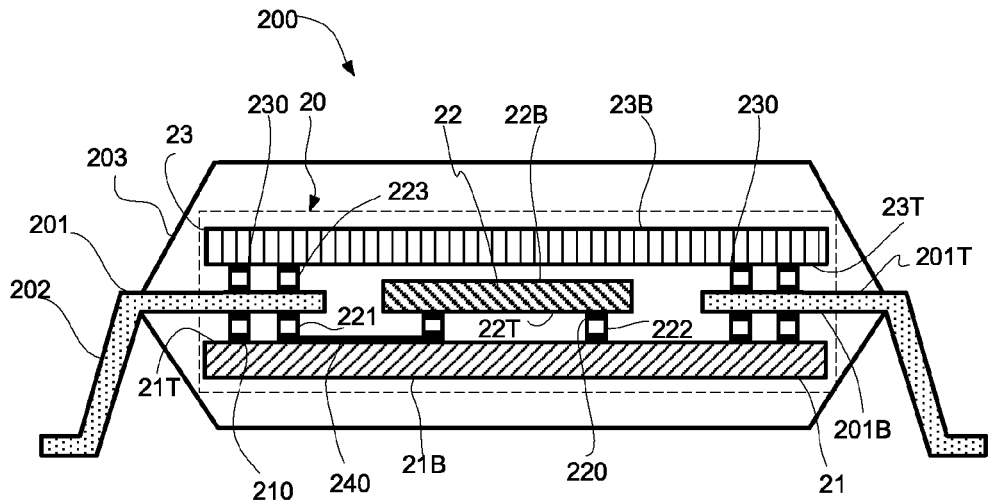
FIG. 2A shows a cross-sectional view of a multi-die package according to one embodiment of the present technology.

FIG. 2A shows a cross-sectional view of a multi-chip package 200 according to one embodiment of the present technology. The package 200 comprises a circuit module 20, a lead frame structure 201, a plurality of bumps 221, 222 and 223, and a molding material 203. The circuit module 20 comprises a first die 21, a second die 22 and a third die 23 (collectively referred to as the "three dies") stacked vertically in sequence. The three dies 21, 22 and 23 are electrically and mechanically coupled together through the flip chip bumps (221, 222 and 223) and the lead frame structure 201 to enable electrical communications among the three dies 21, 22 and 23 internally, and between the three dies 21, 22, and 23 and external circuitry. Accordingly, the first die 21, the second die 22 and the third die 23 can be referred to as the first flip chip die 21, the second flip chip die 22 and the third flip chip die 23 respectively.

In the circuit module 20, the first flip chip die 21, the second flip chip die 22 and the third flip chip die 23 individually define a top or first surface 21T, 22T, 23T on which circuit/circuits and electrical contact pads are formed, and a bottom or second surface 21B, 22B, 23B at the opposite surface of the top surface 21T, 22T, 23T respectively. The first contact pads 210 are positioned on the surface 21T and are coupled to a plurality of first flip chip bumps 221. The second contact pads 220 are positioned on the surface 22T and are coupled to a plurality of second flip chip bumps 222. The third contact pads 230 are positioned on the surface 23T and are coupled to a plurality of third flip chip bumps 223 respectively for internal or external electrical interconnections and/or for thermal dissipation.

A lead frame structure 201 comprises a plurality of leads 202, and is configured to transmit electrical signals inside the circuit module 20 and between the circuit module 20 and the external circuitry through the package leads 202. The lead frame structure 201 comprises a top surface 201T and a bottom surface 201B. As shown in FIG. 2A, the first flip chip die 21 is mounted on the bottom surface 201B and electrically coupled to leads 202 of the lead frame structure 201 through the first flip chip bumps 221, and the top surface 23T of the third die 23 is mounted on the top surface 201T and electrically coupled to some leads 202 of the lead frame structure through the third bumps 223. The second flip chip die 22 is mounted on and electrically coupled to the top surface of the first die 21 through the second flip chip bumps 222.

The bumps 221, 222 and 223 are in pillar shape as shown in FIG. 2A, and can be referred to as the first pillar bumps 221, the second pillar bumps 222 and the third pillar bumps 223 respectively. A pillar bump is in a pillar shape. A pillar bump usually comprises a copper post with a solder cap on top, and the solder cap can be reflowed to the top surface pad of another die to make a connection between the two dies or the top surface of the lead frame to make a connection between a die and a lead frame. Since the copper posts do not collapse during thermal reflow, the pillar bump represents an elongated shape and ensures sufficient space between the first die 21 and the third die 23, thus to facilitate the placement of the second die 22.

In the configuration shown in FIG. 2A, the interconnections among the three dies 21, 22 and 23 and the lead frame structure 201 are electrically coupled together by the pillar bumps 221, 222 and 223. Other embodiments of the present technology may include solder balls, and/or any other suitable interconnecting components. The pillar bumps and the solder balls can be referred to as flip chip bumps or bumps hereinafter. However, adopting pillar bumps can have more sufficient space for holding the second flip chip die 22 in vertical orientation.

The circuit module 20 and the lead frame structure 201 are encapsulated by the molding material 203. In one embodiment, the molding material is epoxy. In other embodiments, the molding material 203 can include other suitable materials.

The first flip chip die 21 is below the lead frame structure 201, and the top surface 21T as shown in FIG. 2A faces upwards and is mounted on the bottom surface 201B of the lead frame structure 201. The second flip chip die 22 can be at least approximately coplanar with the lead frame structure 201. For example, in one embodiment, the second flip chip die 22 can be positioned at a center of the package 200 and the lead frame structure 201 can have a "window" or hollow space (on the horizontal plane) at the center for holding the second flip chip die 22. The second pillar bumps 222 are formed between the second contact pads 220 and the first contact pads 210 such that the second flip chip die 22 is flipped down and mounted on the top surface 21T of the first flip chip die 21. The first flip chip die 21 can serve as a supporting structure for the second flip chip die 22. Furthermore, the first flip chip die 21 can also serve as a medium for the second flip chip die 22 to communicate with the lead frame structure 201, and/or dissipate heat.

The first flip chip die 21 further comprises a plurality of metal layers 240 in and/or on its top surface 21T. Each metal layer 240 is electrically coupled between a first pillar bump 221 and a second pillar bump 222. The metal layers 240 may comprise copper layers in one embodiment though may also comprise other suitable materials in other embodiments.

The electrical communication paths between the second flip chip die 22 and the lead frame structure 201 and/or between the second flip chip die 22 and the third flip chip die 23 are through the metal layer 240, a plurality of first pillar bumps 221 and a plurality of second pillar pumps 222. In some embodiments, the first flip chip die 21 allows the second flip chip die 22 to communicate with external circuitry through the metal layer/layers 240. In other embodiments, the first flip chip die 21 allows the second flip chip die 22 both the internal electrical communication to the third flip chip die 23, and also the external electrical communications to the external circuitry. In yet other embodiments, the first flip chip die 21 only allows the second flip chip die 22 the internal electrical communications to the third flip chip die 23 through the metal layer/layers 240. In such a configuration, the first pillar bumps 221 not only provide electrical communications for the first flip chip die 21, but also for the second flip chip die 22. In addition, portions of the second pillar bump 222 are for electrical communications between the second flip chip die 22 and the first flip chip die 21, and portions of the second pillar bumps 222 are for electrical communications between the second flip chip die 22 and the third flip chip die 23 and/or between the second flip chip die 22 and the external circuitry.

As seen in FIG. 2A, the third flip chip die 23 is flipped down and mounted on the top surface 201T of the lead frame structure 201. The third pillar bumps 223 are formed between the third contact pad 230 and the lead frame structure 201 to form the interconnections between the third flip chip die 23 and the lead frame structure 201. Accordingly, the three flip chip dies 21, 22 and 23 are closely and sequentially stacked together in vertical orientation in the package 200.

Figure 2B:
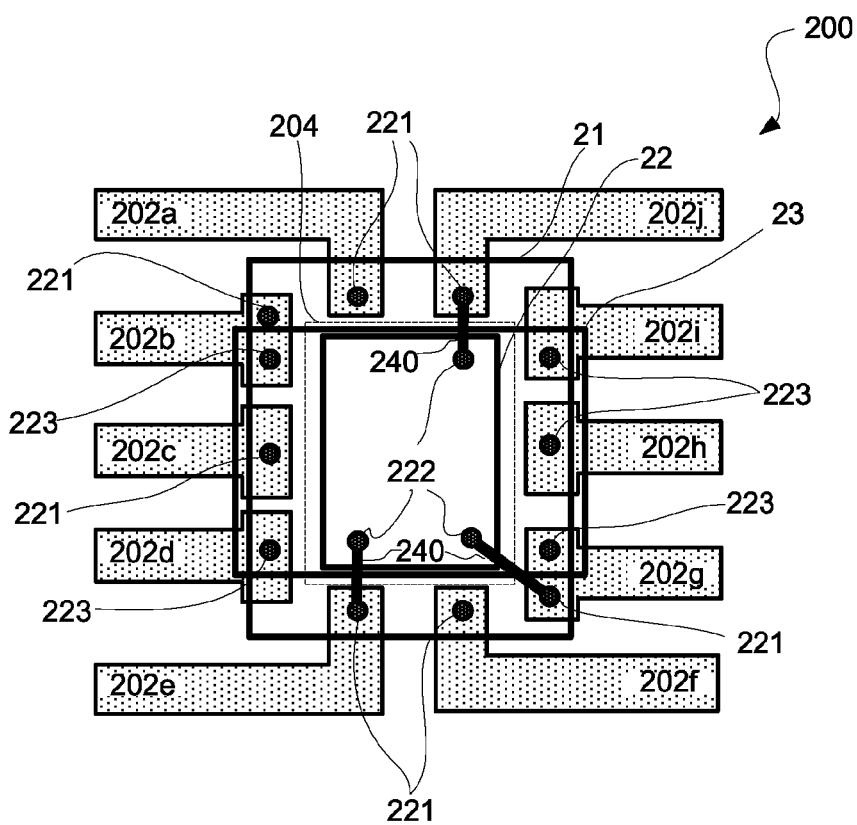
FIG. 2B shows a top plan view of the multi-die package in FIG. 2A.

FIG. 2B shows a top plan view of the multi-die package 200 according to one embodiment of the present technology. The multi-die package 200 comprises the first flip chip die 21, the second flip chip die 22, the third flip chip die 23 and the lead frame structure. The lead frame structure comprises a plurality of leads 202a-202j. The lead frame structure is coupled to the first die 21 through the first bumps 221 and is coupled to the third die 23 through the third bumps 223. The lead frame structure is not coupled to the second flip chip die 22 directly through the bumps. In contrast, the lead frame structure forms a "hollow" or "window" 204 in the center for holding the second flip chip die 22. And the second flip chip die 22 is coupled to the lead frame structure through the metal layer 240 on/in the first flip chip die 21.

In particular, the second flip chip die 22 is first electrically coupled to the first flip chip die 21 through the second flip chip bumps 222, and then coupled to the lead frame structure through the metal layers 240 in and/or on the top surface of the first flip chip die 21 and the first flip chip bump/bumps 221. In one example, the leads 202a, 202c and 202f are coupled to the first flip chip die 21 through the first flip chip bumps 221. The second lead 202b is coupled both to the first flip chip die 21 through a first flip chip bump 221 and to the third flip chip die 23 through a third bump 223. The leads 202d, 202h and 202i are coupled to the third die 23 through the third bumps 223. The leads 202e and 202j are coupled to the second die 22 through the first bumps 221, the metal layers 240 on the first die 21 and the second bumps 222. The lead 202g is coupled to all of the three dies 21, 22 and 23. The lead 202g is coupled to the first die 21 through a first bump 221 and coupled to the third die 23 through a third bump 223. The lead 202g is coupled to the second die 22 through the same first bump 221, a metal layer 240 on the first die 21 and a second bump 222.

Figure 3A:
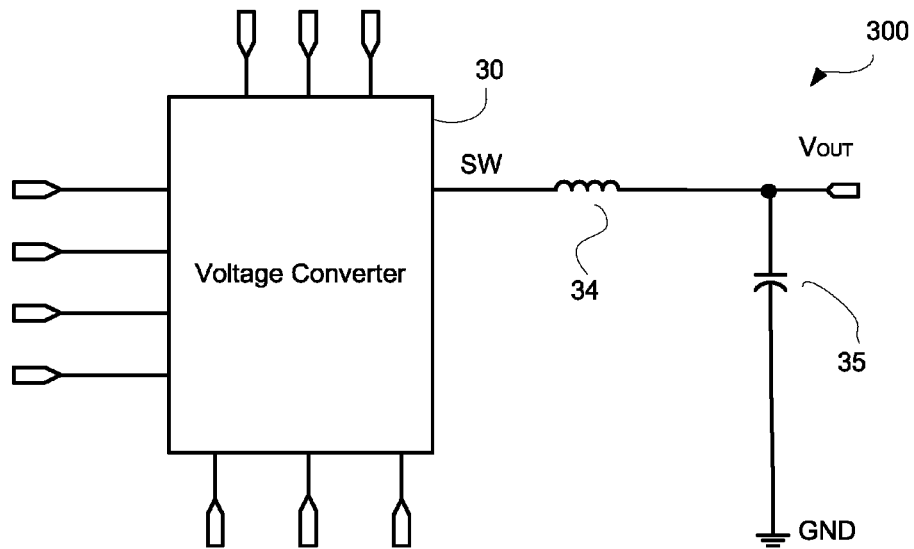
FIG. 3A shows a buck converter comprising a converter module according to one embodiment of the present technology.

For better understanding, a single-phase buck converter is described in the following paragraphs as an example device that may have the package configuration discussed above. In this embodiment, the circuit module 20 as shown in FIG. 2A is a converter module. The converter module 30 is shown in FIG. 3A by dashed lines in FIG. 3B. And a top plan view of a multi-chip package 400 of the converter module 30 is shown in FIG. 4 as one embodiment of the present technology. However, the technology disclosed here can also be applied in any suitable integrated circuit chips and/or systems, for example, a boost converter system.

FIG. 3A shows a buck converter 300 according to one embodiment of the present technology. A buck converter is used to convert a direct current voltage of a first value into a direct current voltage of a second value lower than the first value, or called a DC to DC voltage converter. The buck converter 300 generally contains a converter module 30, an output inductance 34 and an output capacitor 35. For the embodiment shown in FIG. 3A, the inductance 34 and the capacitor 35 are discrete devices external to the converter module 30. The output port SW of the converter module 30 connects with one terminal of the output inductance 34. The other terminal of the inductance 34 couples with the output capacitor 35 and provides the output voltage $V_{OUT}$. In other embodiments, the inductance 34 and the capacitor 35 may be integrated into the converter module 30 and the converter module 30 can the output voltage $V_{OUT}$ directly. The converter module 30 further comprises a plurality of input/output terminals.

Figure 3B:
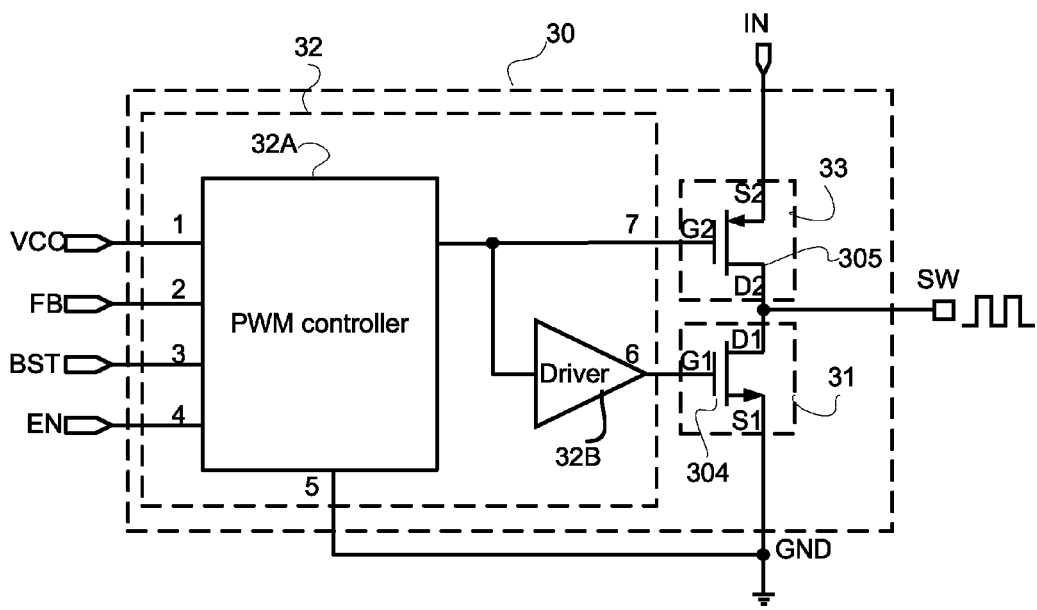
FIG. 3B shows a schematic diagram of a converter module according to one embodiment of the present technology.
Figure 4:
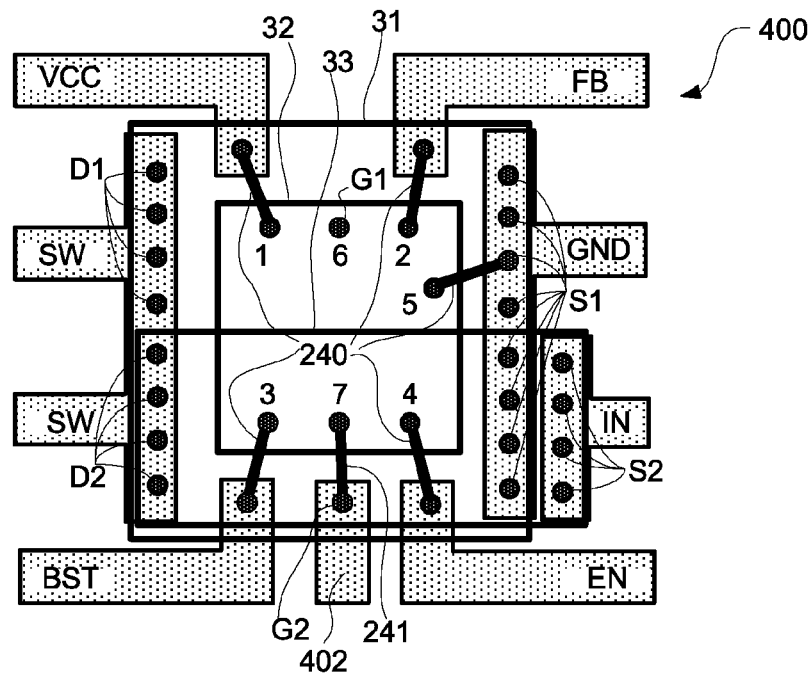
FIG. 4 shows a top plan view of a multi-die package for the converter module in FIG. 3B according to one embodiment of the present technology.

Now turning to FIG. 3B, the inner structure schematic diagram of a converter module 30 is depicted according to one embodiment. The converter module 30 comprises three dies, including a first flip chip die 31 as the low-side switch die, a second flip chip die 32 as the Pulse Width Modulator (PWM) controller die and a third flip chip die 33 as the high-side switch die.

The embodiment presented in FIG. 3B adopts a P-type metal-oxide semiconductor field-effect transistor (PMOS-FET, abbreviated as PMOS in the following text) as the high-side switch 305, or primary switch. An N-type MOSFET (NMOS) is adopted as the low-side switch 304, or synchronous rectifier. The PMOS as the high-side switch 305 does not need a MOSFET driver during operation because it conducts when the gate voltage is at low state. In other embodiments, the high-side switch 305 can include NMOS and the low-side switch 304 can include PMOS. The switching of the switch devices 304 and 305 are controlled by the controller die 32. Although applying a bi-CMOS process to integrate all switch devices and other circuit modules into one die can minimize required space, the operation voltage and max current of the switch may be restricted.

According to the shown MOSFET design, the PWM controller die 32 may include the PWM signal generator or PWM controller 32A, the NMOS driver 32B, the delay circuit and/or other suitable modules with various functions (not shown in FIG. 3B). The high-side switch 305 and the low-side switch 304 can be vertical metal-oxide semiconductor field-effect transistors (VMOSFET), bipolar junction transistors (BJT), vertical-double-diffused MOSFETs (VDMOS), and/or any suitable device in other embodiments. Some other embodiments may further include a monitoring circuit, the output inductance, additional paralleled discrete switch device pairs and/or other suitable periphery modules in the flip chip die 31, 32 or 33.

According to one embodiment, the controller die 32 comprises five input terminals 1-5 and two output terminals 6-7. The first input terminal 1 is electrically coupled to the port VCC to receive power for supplying the controller die 32, the second input terminal 2 is electrically coupled to the port FB to receive the feedback signal of the converter, the third input terminal 3 is electrically couple to the port BST for boost-strap control to deliver the correct driving voltage to the switch, the fourth input terminal 4 is electrically coupled to the port EN for enable control and the fifth input terminal 5 is electrically coupled to the external ground GND. The first output terminal 6 is electrically coupled to the gate of the low-side switch die 31 and the second output terminal 7 is electrically coupled to the gate of the high-side switch die 33. In other embodiments, the numbers of the input terminals and output terminals of the controller die 32 may vary and with different functions.

Inside the second flip chip die 32, the PWM controller 32A receives several control signals from the input terminals 1-5. The output of the PWM controller 32A provides a signal for controlling the high-side PMOS 305 and the low-side NMOS 304 on and off alternatively. A MOSFET driver 32B is adopted for driving the gate or a first control terminal G1 of the low-side NMOS 304 at the terminal 6. A delay circuit may be settled before the gate G1 of the low-side NMOS 304 for setting up a dead time to prevent the two MOSFET switches 304 and 305 turned on simultaneously in one embodiment. The terminal 7 of the controller die 32 puts out a control signal for driving the gate or a second control terminal G2 of the high-side switch 305. For package configuration, the controller die 32 receives the external control signals and drives the high-side switch die 33 through the intermediate metal layers on the low-side switch die 31.

Continuing with FIG. 3B, the low-side switch die 31 comprises a drain electrically coupled to a drain terminal or called first terminal D1, a source electrically coupled to a source terminal or called second terminal S1 and a gate electrically coupled to a gate terminal or first control terminal G1. The high-side switch die 33 also comprises a drain electrically coupled to a drain terminal or called third terminal D2, a source electrically coupled to a source terminal or called fourth terminal S2 and a gate electrically coupled to a gate terminal or called second control terminal G2.

The drain terminal D1 of the NMOS 304 and the drain terminal D2 of the PMOS 305 are connected together to form the output port SW. The source terminal S1 of the low-side NMOS switch 304 is electrically coupled to the ground port GND while the source terminal S2 of the high-side PMOS switch 305 is coupled to the input voltage port IN to provide the unregulated input voltage. The source of the high-side switch 305 is electrically coupled to the external input voltage port IN through a plurality of flip chip bumps, and the source of the low-side switch 304 is electrically coupled to the external ground port GND through a plurality of flip chip bumps. Both of the drains are electrically coupled to the port SW as a first lead of the lead frame structure through a plurality of flip chip bumps. The output port SW is connected to the external filter comprising the output inductor and the output capacitor as shown in FIG. 3A. Controlled by the controller die 32, the low-side switch 304 and the high-side switch 305 are turned on and off alternatively and the direct current (DC) input voltage between the port IN and the ground port GND is shifted into a pulse voltage at the output port SW. The external filter converts the pulse voltage at the output port SW to DC voltage.

FIG. 4 shows a top plan view of a multi-die package 400 for the converter module 30 in FIG. 3B. The package 400 comprises three dies, including a low-side switch die 31 as a bottom die, a controller die 32 in the center of the package 400 and a high-side switch die 33 as a top die. The package 400 further comprises a lead frame structure and a plurality of flip chip bumps for electrically and structurally coupling and stacking the three dies 31, 32 and 33 together. In FIG. 4, the leads of the lead frame structure are illustrated in the pattern filled with sporadic dots and the flip chip bumps are illustrated in the pattern filled with dense dots.

The plurality of leads include a first lead or called the output lead SW, a second lead or called the ground lead GND, a third lead or called the input voltage lead IN, a fourth lead 402, and a plurality of fifth leads VCC, FB, BST, EN. The leads function as the corresponding ports in the same labels as shown in FIG. 3B. The controller die 32 has a plurality of contact pads 1-7 on its top surface functioning as its input/output terminals. And flip chip bumps are positioned onto the contact pads 1-7 such that the controller die 32 is mounted on the top surface of the low-side switch die 31 through the bumps with a reflow. The low-side switch die 31 comprises a plurality of drain contact pads D1 at the left side and plurality of source contact pads 51 at the right side. Flip chip bumps are positioned on the contact pads D1 and 51 such that the low-side switch die 31 is mounted on the bottom surface of the lead frame structure through the bumps. The high-side switch die 33 comprises a plurality of drain contact pads D2 at the left side and a plurality of source contact pads S2 at the right side. Flip chip bumps are positioned on the contact pads D2 and S2 such that the high-side switch die 33 is mounted on the top surface of the lead frame structure with a reflow. Metal layers 240 are formed in and/or on the low-side switch die 31 to electrically couple the controller die 32 to the external circuitry and/or to the high-side switch die 33. One end of a metal layer 240 is electrically coupled to the flip chip bump/bumps between the controller die 32 and the low-side switch die 31, and the other end of the metal layer 240 is electrically coupled to the flip chip bump/bumps between the low-side switch die 31 and the lead frame structure.

In particular, the drain contact pads D1 of the low-side switch die 31 are coupled to the output lead SW through flip chip bumps. The source contact pads 51 of the die 31 are coupled to the lead GND through flip chip bumps. The drain contact pads D2 of the high-side switch die 33 are coupled to the lead SW through flip chip bumps and the source contact pads S2 of the die 33 are coupled to the lead IN through flip chip bumps. Furthermore, the output contact pad 6 of the controller die 32 is electrically coupled to the gate contact pad G1 of the low-side switch die 31 directly under the output contact pad 6 through a flip chip bump. The output contact pad 7 of the controller die 32 is electrically coupled to the gate contact pad G2 of the high-side switch die 33 through the metal layer 241 on the low-side switch die 31. The output contact pad 7 is firstly coupled to one end of the metal layer 241 through a second bump. The other end of the metal layer 241 is coupled to the lead 402 through a first bump and the lead 402 is coupled to the gate contact pad G2 on the high-side switch die 33 through a third bump. At the position of the gate contact pad G2, there exist two bumps overlapped together, wherein one bump is between the low-side switch die 31 and the lead 402 and the other bump is between the lead 402 and the high-side switch die 33.

In one embodiment, the lead 402 is exposed at the surface of the package 400 as an external lead. In other embodiments, the lead 402 is not exposed outside the package since it only acts as an intermediate between the high-side switch die 33 and the controller die 32. The input contact pads 1-5 of the controller die 32 are electrically coupled to the leads VCC, FB, BST, EN and GND respectively through the low-side switch die 31. The input contact pads 1-5 are firstly coupled to the low-side switch die 31 through the second bumps between the controller die 32 and the low-side switch die 31, then coupled to the other positions of the die 31 directly under the respective leads through the metal layers 240, and finally coupled to the leads VCC, FB, BST, EN and GND through the first bumps between the low-side switch die 31 and the lead frame structure.

With the above configuration, the package 400 can perform the function of the converter module 30 as shown in FIG. 3B. Each source or drain (S1, S2, D1, or D2) of the low-side switch die 31 or the high-side switch die 33 is coupled to a lead through a plurality of bumps, thus, high current carrying ability and high power efficiency can be achieved. Meanwhile, all of the low-side switch die 31, the controller die 32 and the high-side switch die 33 are co-packaged in a single tri-stacked package, and the size of the module is reduced.

Figure 5:
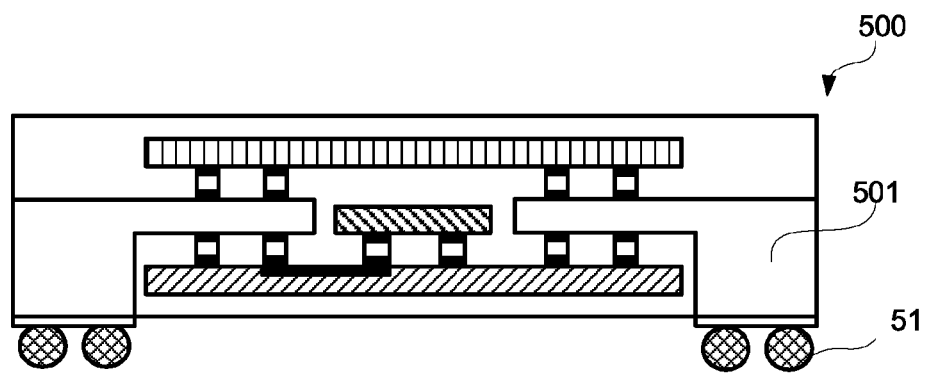
FIG. 5 shows a cross-sectional view of a package according to one embodiment of the present technology.

The package as shown in FIG. 2A is a leaded package in small outline package (SOP) form. However, the package can also be leadless package according to some embodiments of the present technology. FIG. 5 shows a cross-sectional view of a package 500 in ball grid array (BGA) form according to one embodiment of the present technology. Balls 51 are implanted onto the exposed bottom surface of the lead frame structure 501. In application, the BGA package 500 is attached to the PCB board by the solder balls 51. Since the balls 51 are implanted at the bottom surface of the package 500, the GBA form will further save space on the PCB board.

Figure 6:
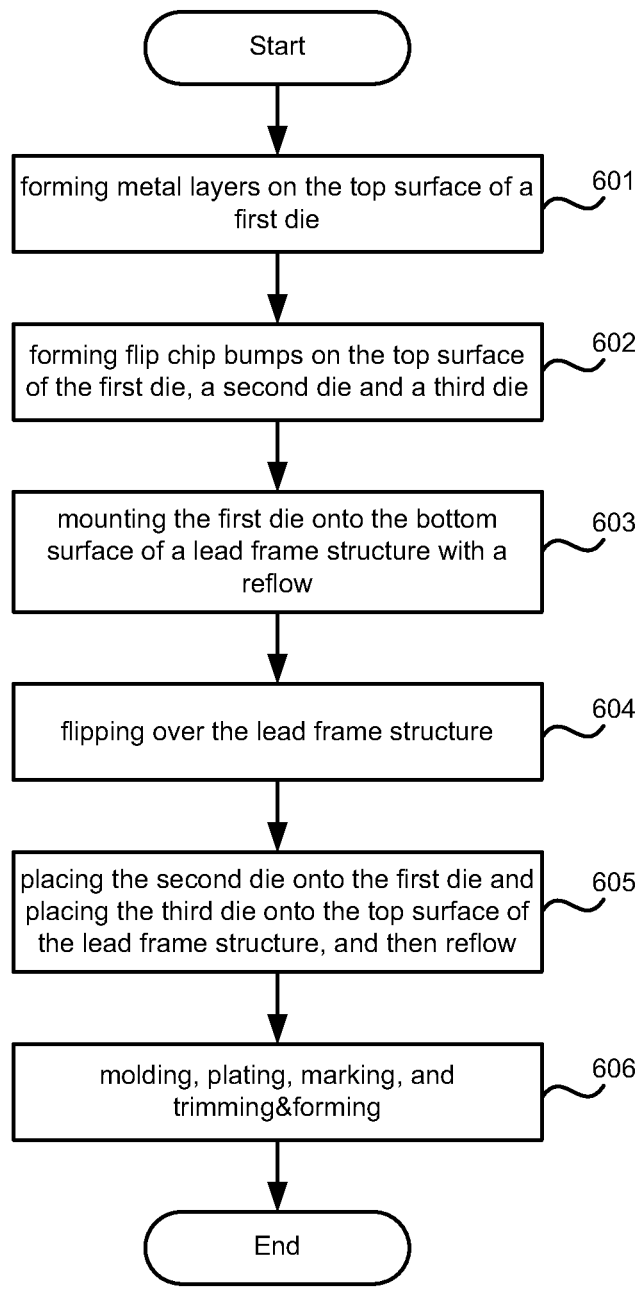
FIG. 6 illustrates a process flow of manufacturing a tri-stacked package according to one embodiment of the present technology.

FIG. 6 shows a packaging method according to one embodiment of the present technology. In the first operation 601, metal layers are formed on the top surface of a first die. Some of the metal layers may be electrically coupled to the terminals of the first die. Other metal layers can be floated on and/or in the surface of the first die without coupling to the input/output terminals of the first die and only function as an electrical communication medium for a second die.

In operation 602, flip chip bumps are formed onto the contact pads on the top surfaces of the first die, the second die and a third die for electrically coupling the bumps to the input/output terminals of the dies. Flip chip bumps are also formed onto the ends of the metal layers on the first die.

In operation 603, a lead frame structure is flipped down with its bottom surface faced upwards, and the first die is placed on the bottom surface of the lead frame structure. The first die and the lead frame structure are jointed together through the bumps with a thermal reflow. In operation 604, the lead frame structure is flipped over with its top surface faced upside.

The lead frame structure and the first flip chip die can be supported by a cavity template tool for the next operations. In operation 605, the second flip chip die is placed onto the top surface of the first flip chip die and a third flip chip die is placed onto the top surface of the lead frame structure. Then thermal reflow is performed to make the solder joint between the second die and the first die, and also the solder joint between the third die and the lead frame structure. Finally, molding operation to encapsulate the three dies and the lead frame structure, the plating operation for the lead surface finish, the marking operation, the trimming and forming operation, and/or other suitable processing operations are performed in block 606 to finalize the packaging.

From the foregoing, it will be appreciated that specific embodiments of the technology have been described herein for purposes of illustration, but that various modifications may be made without deviating from the disclosure. For example, though "lead" or "leads", "contact bump" or "contact bumps", "pad" or "pads" and other similar terms are referred in the description with singular or plural forms, it is not confined to the singular or plural numbers, and any number may be practiced in the embodiments without departing from the sprit of the present technology. In addition, many of the elements of one embodiment may be combined with other embodiments in addition to or in lieu of the elements of the other embodiments. Accordingly, the disclosure is not limited except as by the appended claims.

I claim:

1. A multi-die package comprising:
   a first flip chip die;
   a second flip chip die;
   a third flip chip die; and
   a lead frame structure comprising a plurality of leads, wherein the lead frame structure has a top surface and a bottom surface;
   and wherein the first flip chip die is coupled to the bottom surface of the lead frame structure through a plurality of first bumps, the second flip chip die is coupled to the first flip chip die through a plurality of second bumps, and the third flip chip die is coupled to the top surface of the lead frame structure through a plurality of third bumps;
   and wherein the first flip chip die comprises a plurality of metal layers configured to provide electrical communication between the second flip chip die and the lead frame structure.

2. The package of claim 1, further wherein the plurality of metal layers are configured to provide electrical communication between the second flip chip die and the third flip chip die.

3. The package of claim 1 wherein the leads comprises a first lead, a second lead, a third lead, and a fourth lead and wherein:
   the first flip chip die comprises a first terminal, a second terminal, and a first control terminal, wherein the first terminal is electrically coupled to the first lead through the plurality of bumps and the second terminal is electrically coupled to the second lead through the plurality of bumps;
   the third flip chip die comprises a third terminal, a fourth terminal and a second control terminal, wherein the third terminal is electrically coupled to the first lead through the plurality of bumps and the fourth terminal is electrically coupled to the third lead through a plurality of bumps; and
   the second flip chip die comprises a first output terminal and a second output terminal, and wherein:
     the first output terminal is electrically coupled to the first control terminal through a bump;
     the second output terminal is electrically coupled to the second control terminal through a bump between the first flip chip die and the second flip chip die, a metal layer on and/or in the first flip chip die, a bump between the first flip chip die and the fourth lead, and a bump between the fourth lead and the third flip chip die.

4. The package of claim 3 wherein the leads further comprise a plurality of fifth leads, and the second flip chip die further comprises a plurality of input terminals, and wherein the input terminals are electrically coupled to the fifth leads through a plurality of bumps between the first flip chip die and the second flip chip die, a plurality of metal layers on and/or in the first flip chip die and a plurality of bumps between the first flip chip die and the fifth leads.

5. The package of claim 3 is electrically coupled to a filter comprising an inductance and a capacitor, wherein one terminal of the inductance is electrically coupled to the first lead and the other terminal of the inductance is electrically coupled to the capacitor.

6. The package of claim 1 wherein the lead frame structure comprises a window configured to receive the second flip chip die.

7. The package of claim 1 wherein the first flip chip die comprises a plurality of contact pads electrically coupled to the first flip chip bumps, the second flip chip die comprises a plurality of contact pads electrically coupled to the second flip chip bumps and the third flip chip die comprises a plurality of contact pads electrically coupled to the third flip chip bumps.

8. The package of claim 1 wherein the bumps are pillar bumps.

9. The package of claim 1 further comprising a molding material encapsulating the first flip chip die, the second flip chip die, the third flip chip die and the lead frame structure.

10. The package of claim 1, wherein the package is in a ball grid array form.

11. A converter module, comprising:
    a first switch die;
    a second switch die;
    a controller die configured to control switching of the first switch die and the second switch die; and
    a lead frame structure comprising a plurality of leads, wherein the lead frame structure has a top surface and a bottom surface;
    and wherein the first switch die is coupled to the bottom surface of the lead frame structure through a first plurality of bumps, the controller die is coupled to the first switch die through a second plurality of bumps and the second switch die is coupled to the top surface of the lead frame structure through a third plurality of bumps.

12. The converter module of claim 11 wherein the first switch die comprises a low-side switch of a buck converter and the second switch die comprises a high-side switch of the buck converter.

13. The converter module of claim 11 wherein the first switch die comprises a plurality of metal layers in and/or on the surface of the first switch die, and wherein each metal layer is electrically coupled between a first bump and a second bump.

14. The converter module of claim 13 wherein the plurality of leads comprises a first lead, a second lead, a third lead and a fourth lead, and wherein:
    the first switch die comprises a drain, a source and a gate, wherein the drain of the first switch die is electrically coupled to the first lead through a plurality of bumps and the source of the first switch die is electrically coupled to the second lead through a plurality of bumps;
    the second switch die comprises a drain, a source and a gate, wherein the drain of the second switch die is electrically coupled to the first lead through a plurality of bumps and the source of the second switch die is electrically coupled to the third lead through a plurality of bumps; and
    the controller die comprises a first output contact pad and a second output contact pad, wherein:
      the first output contact pad is electrically coupled to the gate of the first switch die through a bump;
      the second output contact pad is electrically coupled to the gate of the second switch die through a metal layer on and/or in the first switch die, the fourth lead and a plurality of bumps.

15. The converter module of claim 14, wherein the leads further comprise a plurality of fifth leads and the controller die further comprises a plurality of input contact pads, and wherein the input contact pads are electrically coupled to the fifth leads through a plurality of bumps between the controller die and the first switch die, a plurality of metal layers on or in the first switch die and a plurality of bumps between the first switch die and the fifth leads.

16. The converter module of claim 15 wherein the input contact pads of the controller die comprise a first input contact pad configured to receive power of the controller die, a second input contact pad configured to receive the feedback signal of the converter and a third input contact pad for boost-strap control.

17. A packaging method, comprising:
forming metal layers on a first die;
forming flip chip bumps on the first die, a second die, and a third die;
placing the first die onto the bottom surface of a lead frame structure through the flip chip bumps;
flipping over the lead frame structure;
placing the second die on the first die through the flip chip bumps, and placing the third die on a top surface of the lead frame structure through the flip chip bumps;
coupling the second die to the lead frame structure through the flip chip bumps and the metal layers on the first die; and
performing a thermal reflow operation.

18. The method of claim 17 further comprising:
encapsulating the first die, the second die and the third die with a molding material;
plating leads of the lead frame structure; and
performing trimming and forming operations.

19. The method of claim 17 wherein forming flip chip bumps comprises forming flip chip bumps electrically coupled to the terminals of the first die, the second die and the third die and forming flip chip bumps onto the ends of the metal layers.

* * * * *